United States Patent [19]
Uno

[11] Patent Number: 5,826,177
[45] Date of Patent: Oct. 20, 1998

[54] RADIO TRANSMITTER

[75] Inventor: Masahiro Uno, Saitama, Japan

[73] Assignee: Sony Corporation, Tokyo, Japan

[21] Appl. No.: 670,747

[22] Filed: Jun. 21, 1996

[30] Foreign Application Priority Data

Jun. 27, 1995 [JP] Japan ................................. 7-160983

[51] Int. Cl.$^6$ ................................ H03G 3/30; H03G 3/20
[52] U.S. Cl. .......................... 455/126; 455/115; 455/116; 330/279; 330/284; 330/129
[58] Field of Search ..................... 455/115, 116, 455/126; 330/129, 279, 284

[56] References Cited

U.S. PATENT DOCUMENTS

| | | | |
|---|---|---|---|
| 5,099,204 | 3/1992 | Wheatley, III | 330/279 |
| 5,126,686 | 6/1992 | Tam | 455/126 |
| 5,175,875 | 12/1992 | Yokoya et al. | 455/89 |
| 5,321,721 | 6/1994 | Yamaura et al. | 375/1 |
| 5,337,006 | 8/1994 | Miyazaki | 330/130 |
| 5,408,197 | 4/1995 | Miyake | 330/129 |
| 5,504,776 | 4/1996 | Yamaura et al. | 375/208 |
| 5,606,285 | 2/1997 | Wang et al. | 330/134 |
| 5,646,578 | 7/1997 | Loh et al. | 455/126 |

Primary Examiner—Tommy P. Chin
Attorney, Agent, or Firm—Jay H. Maioli

[57] ABSTRACT

A variable gain amplifier of a transmitter is controlled to obtain optimum transmission power by using a directional coupler and a detector to detect the transmission signal level that is then subtracted from a reference signal corresponding to a desired transmission signal power. The subtracted output is used to control the variable gain amplifier. The reference signal is generated by a control circuit and a digital-to-analog convertor that produce an attenuated basic reference signal. The attenuated basic reference signal is further adjusted in signal level by a voltage divider network that is controlled by a number of control signals produced by the control circuit.

8 Claims, 4 Drawing Sheets

RADIO TRANSMITTER

BACKGROUND OF THE INVENTION

The present invention relates to a radio transmitter for use with a radio communication system, e.g., as a mobile station of a portable telephone system.

In accordance with the standard STD-27 of Japanese digital cellular phone system (portable telephone system) standardized by Foundation of Radio System Research Center, a telephone system comprises a base station and a mobile station, and a transmission signal power of the mobile station is controlled by transmitting a setting signal for controlling the transmission signal power of the mobile station from the base station to the mobile station.

Therefore, according to the standard of mobile station of such portable telephone system, a transmission signal power of a mobile station with a maximum transmission signal power of 0.8 W is requested to set the transmission signal power between 0 and −20 dB at the step of 4 dB where the maximum transmission signal power is 0 dB.

An allowance range of error in control of the transmission signal power of the mobile station is generally determined between +2 dB and −4 dB with respect to the designated control value, and determined between +20% and −50% (corresponding to +0.8 dB and −3 dB in case the maximum transmission signal power is 0.8 W) with respect to the maximum transmission signal power.

FIG. 1 of the accompanying drawings shows a circuit for use with a radio transmitter whose transmission signal power is controlled as described above.

As shown in FIG. 1, a transmission signal modulated by a modulator 21 is amplified to a desired electric power by a variable gain amplifier 22, an excitation amplifier 23 and a final-stage amplifier 24, and supplied through a directional coupler 25 to an antenna 26, from which it is radiated.

A transmission signal distributed by the directional coupler 25 is detected by a detector 27. Thus, the detector 27 outputs a detected voltage which reflects a transmission signal power supplied to the above antenna 26.

On the other hand, a control circuit 28 generates a signal for setting a digital-to-analog (D/A) converter 29 in such a way as to generate a reference voltage corresponding to a desired transmission signal power in accordance with the above setting signal. Thus, the D/A converter 29 outputs a reference voltage corresponding to the desired transmission signal power in accordance with the above setting signal.

The reference voltage from the D/A converter 29 and the detected voltage from the detector 27 are supplied to a subtracter 30, and a subtracted result from the subtracter 30 is supplied through a low-pass filter 31 to a gain control terminal of the variable gain amplifier 22, thereby resulting in a gain of this variable gain amplifier 22 being determined.

The above-mentioned block forms a feedback loop for determining a transmission signal electric power. In this case, if the low-pass filter 31, for example, is a primary integral type, then this feedback loop responds such that the output from the subtracter 30 becomes 0 [V], and is stabilized when the detected voltage becomes equal to the reference voltage.

Specifically, in the above-mentioned block, transfer functions expressed by Laplace transform are defined as shown in FIG. 2, and respective transfer functions are set as follow:

Variable gain amplifier 22 . . . Ag [W/V]
Excitation amplifier 23 . . . Ad
Final-stage amplifier 24 . . . Af
Directional coupler 25 . . . Ac
Detector 27 . . . Bd [W/V]
Low-pass filter 31 . . . H(s)

Blocks in the circuit shown in FIG. 2 are exactly the same as those in the circuit shown in FIG. 1.

In FIG. 2, a reference voltage x(s) from the D/A converter 29 assumes an input and a transmission signal electric power y(s) supplied to the antenna 26 assumes an output. Then, a transfer function of this circuit is expressed by the equation (1) below:

$$G(s) = \frac{y(s)}{x(s)} = \frac{Ac\,Af\,Af\,Ad\,Ag\,H(s)}{1 + Ac\,Af\,Ad\,Ag\,Bd\,H(s)} \quad (1)$$

$$= \frac{1}{\frac{1}{AH(s)} + Bd}$$

where Ac Af Ad Ag=A.

If the low-pass filter 31 is a complete integral type having H(s) expressed as:

$$H(s) = \alpha/s \quad (2)$$

then the above equation (1) is expressed as:

$$G(s) = \frac{1}{\frac{s}{A\alpha} + Bd} \quad (3)$$

Therefore, if the reference voltage is set to the constant value, x(t)=V, then when t→∞, a transmission signal electric power y(t) is expressed as:

$$\lim_{t\to\infty} y(t) = \lim_{s\to\infty} sy(s) \quad (4)$$

$$= \lim_{s\to\infty} \frac{1}{\frac{s}{A\alpha} + Bd} \cdot \frac{V}{s} s$$

$$= \frac{V}{Bd}$$

Therefore, in the above-mentioned block, the transmission signal electric power y(t) can be defined by the reference voltage V. In this case, the power w of the subtracter 30 is expressed as:

$$w = V - \frac{V}{Bd} Bd = 0 \quad (5)$$

Thus, the output from the subtracter 30 is converged to 0V, and the feedback loop is stabilized when the detected voltage becomes equal to the reference voltage.

In the standard STD-27 of the mobile station of the above portable telephone system, when the value of the level of the transmission signal electric power is calculated as:

$$10 \log_{10} \frac{P[mW]}{1[mW]} \, [dBm] \quad (6)$$

in the standard STD-27 where the maximum transmission signal electric power is 0.8 W, it is requested that the transmission signal electric power can be set between +9 dBm and +29 dBm at the step of 4 dB.

The allowable control error of the transmission signal electric power is determined as +0.8 dB/−3 dB with respect to the designated control value in the case of the maximum output, and +2 dB/−4 dB in other cases.

FIG. 3 shows, by way of example, measured results of high frequency input electric power versus DC output electric power characteristics of the detector 27. The output voltage of the detector 27 becomes equal to the reference voltage from the D/A converter 29 based on the equation (6) which describes operation of the above feedback loop. Therefore, from a control standpoint, the vertical and horizontal axes shown in FIG. 4 are replaced with each other, and a relationship between the output voltage and the reference voltage shown in FIG. 4 is considered.

In FIG. 4, when the output electric power is large, the amount in which the output electric power is changed with respect to the reference electric power is small. On the other hand, when the output voltage is small, the amount in which the output electric power is changed with respect to the reference voltage is large.

Specifically, assuming that the accuracy of the D/A converter 29 is 8 bits and that the reference voltage of the D/A converter 29 is 3.0 V, then the changed amount of 1 LSB is expressed as:

$$(3.0/2^8)-1=12 \ [mV] \tag{7}$$

On the other hand, if the transfer function of the directional coupler 25 is expressed as:

$$Ac=-15 \ [dBm] \tag{8}$$

when a desired electric power is +29 dB, the input electric power of the detector 27 is expressed as:

$$29-15=14 \ [dBm] \tag{9}$$

when a desired electric power is +9 dBm, the input electric power of the detector 27 is expressed as:

$$9-15=-6 \ [dBm] \tag{10}$$

A study of FIG. 3 reveals that, when the input to the detector 27 is +14 dBm, the output voltage of the detector 27 is expressed as:

$$1.13 \ [V] \tag{11}$$

Also, a study of FIG. 3 reveals that, when the input to the detector 27 is −6 dBm, the output voltage of the detector 27 is expressed as:

$$0.637 \ [V] \tag{12}$$

Further, a study of FIG. 4 reveals that, when the input to the detector 27 is +14 dBm, the amount in which the output voltage is changed with the change (=12 mV) of the 1 LSB is expressed as:

$$0.2 \ [dB] \tag{13}$$

Also, a study of FIG. 4 reveals that, when the input to the detector 27 is −6 dBm, the amount in which the output voltage is changed with the change (=12 mV) of the 1 LSB is expressed as:

$$2.4 \ [dBm] \tag{14}$$

The following table 1 shows these results.

TABLE 1

| Desired output electric power | Input electric power of detector | Changed amount of reference voltage of 1 LSB | Changed amount of output electric power with respect to 1 LSB |
|---|---|---|---|
| 29 dBm | 15 dBm | 12 mV | 0.2 dB |
| 9 dBm | −5 dBm | 12 mV | 2.4 dB |

Accordingly, as is clear from the table 1, in the case of the output of 29 dBm, the changed amount per 1 LSB is as sufficiently small as 0.2 dBm so that the transmission signal electric power can be controlled with a desired accuracy. However, in the case of the output of 9 dBm, the changed amount per 1 LSB is 2.4 dBm, and the changed amount of one step is considerably large. As a result, the transmission signal electric power cannot be controlled with a desired accuracy. To solve this problem, it is proposed to increase the resolution of the D/A converter 29. However, this previously-proposed method causes the circuit scale of the D/A converter to become large, and also causes various problems.

In short, the conventional circuit can control the transmission signal electric power with a desired accuracy when the transmission signal electric power is large. However, when the transmission signal electric power is small, the conventional circuit cannot control the transmission signal electric power with a desired accuracy. Furthermore, if the resolution in controlling the transmission signal electric power is increased, then the circuit scale of the D/A converter is unavoidably increased, and there arise various problems.

SUMMARY OF THE INVENTION

It is therefore an object of the present invention to provide a radio transmitter in which a reference voltage for controlling a transmission signal electric power to a desired value is set stepwise, the thus set reference voltage is supplied through a predetermined voltage-dividing means and compared with a detected voltage of a transmission signal electric power and the transmission signal electric power is controlled in response to a compared output.

According to an aspect of the present invention, there is provided a transmitter apparatus for transmitting radio waves which is comprised of a variable amplifier for amplifying a signal with a variable amplitude gain, a dividing circuit for dividing a signal to a plurality of directions, a detecting circuit for detecting a signal from the dividing circuit, a reference signal generating circuit for generating a reference signal, a subtracting circuit for subtracting an output signal of the detecting circuit from an output signal of the reference signal generating circuit, an output signal of the subtracting circuit being supplied to the variable amplifier for a gain control signal, wherein the reference signal generating circuit comprises a generating circuit for generating a basic reference signal, a setting circuit for setting a reference signal as stepped values, and a decreasing voltage circuit for decreasing voltages of an output signal of the generating circuit.

DETAILED DESCRIPTION OF THE PREFERRED EMBODIMENT

Before describing the present invention, the most specific feature of the present invention will be described below in brief.

According to the present invention, in a radio transmitter in which a modulated signal is amplified by a variable gain amplifier and a power amplifier and supplied to an antenna, a detected voltage which reflects a transmission signal electric power supplied to the antenna is outputted and the detected voltage is compared with an arbitrary reference voltage, the transmission signal electric power is controlled to a predetermined value by controlling the gain of the variable gain amplifier in response to a compared output, a reference voltage is set stepwise, and the thus set reference voltage is processed by a predetermined voltage-dividing means and compared with the detected voltage.

Figure 1:
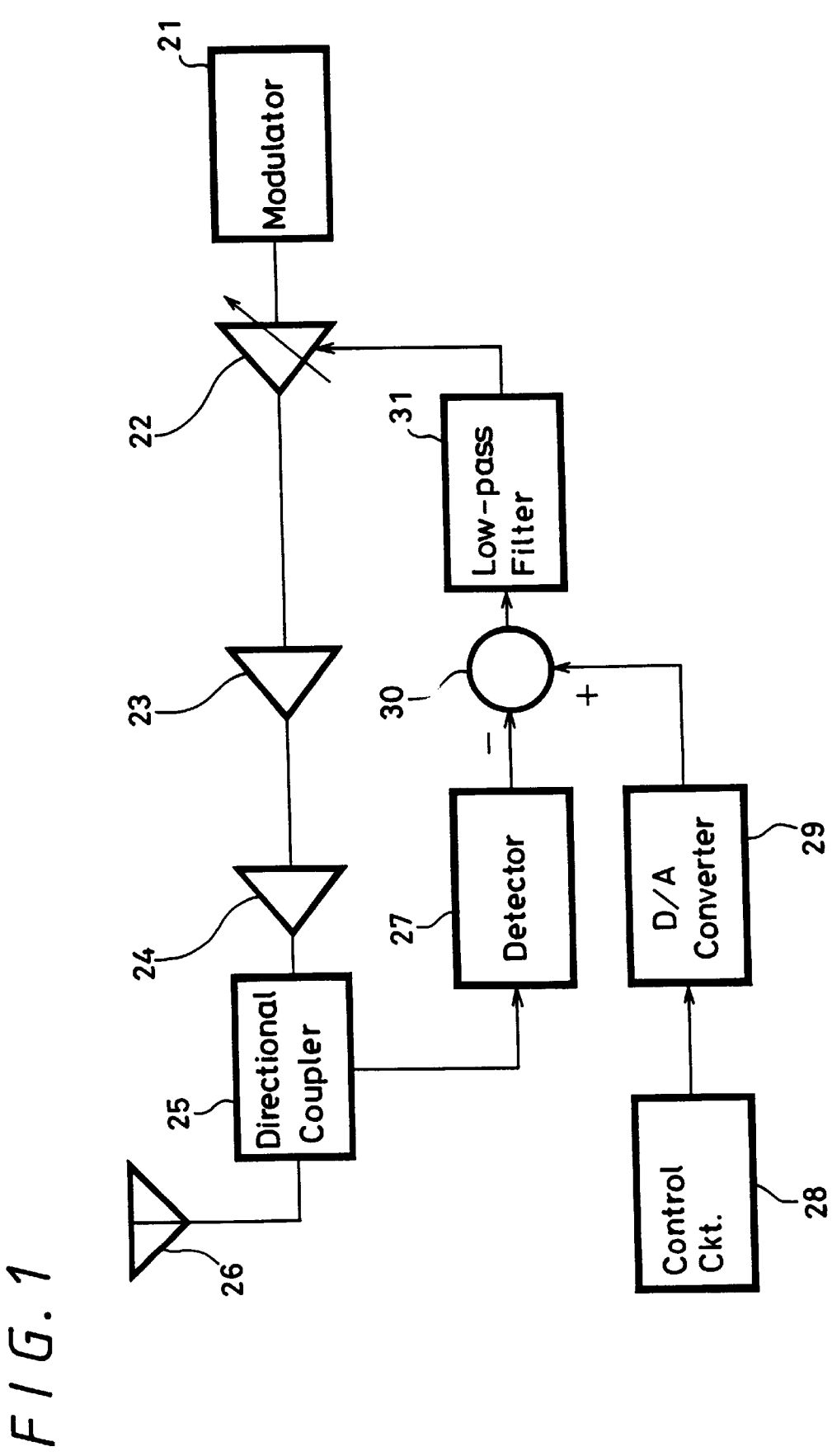
FIG. 1 is a block diagram showing a convention circuit for a radio transmitter.
Figure 2:
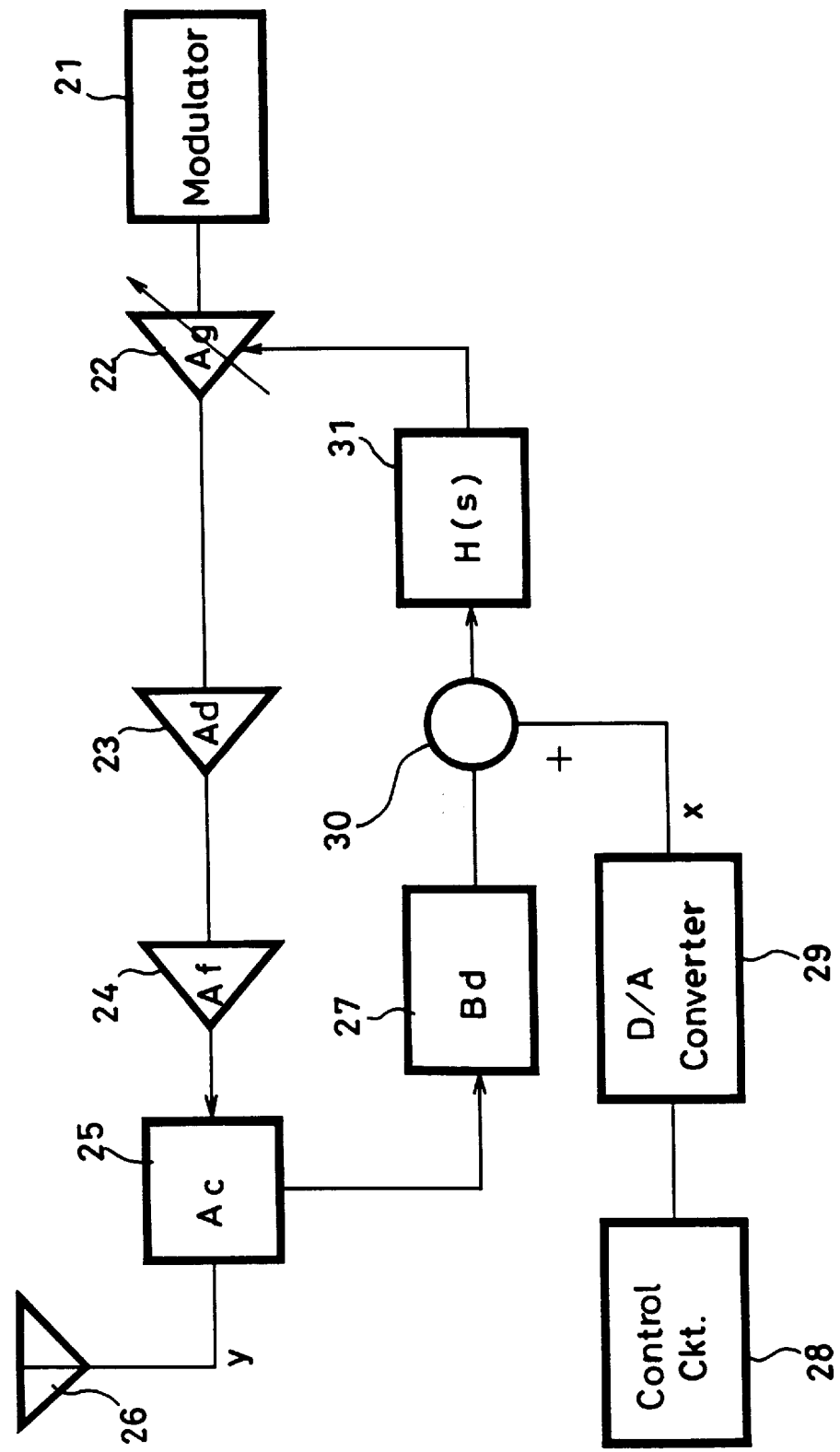
FIG. 2 is a block diagram used to explain transfer functions of the conventional circuit shown in FIG. 1.
Figure 3:
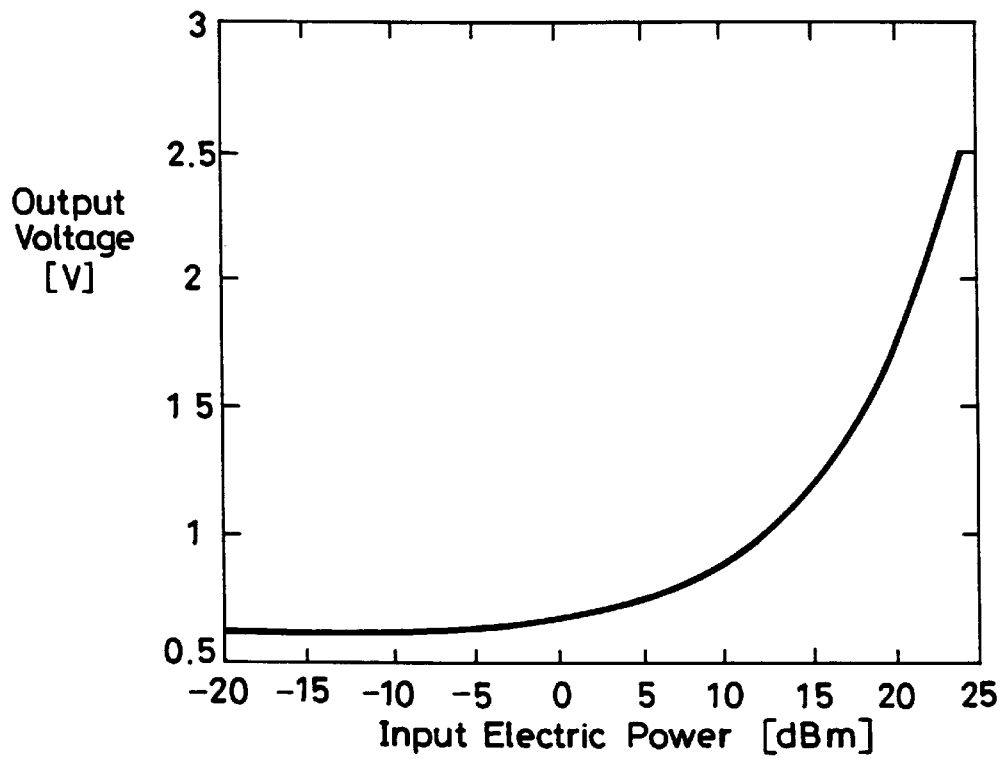
FIG. 3 is a characteristic graph used to explain the conventional circuit shown in FIG. 1.
Figure 4:
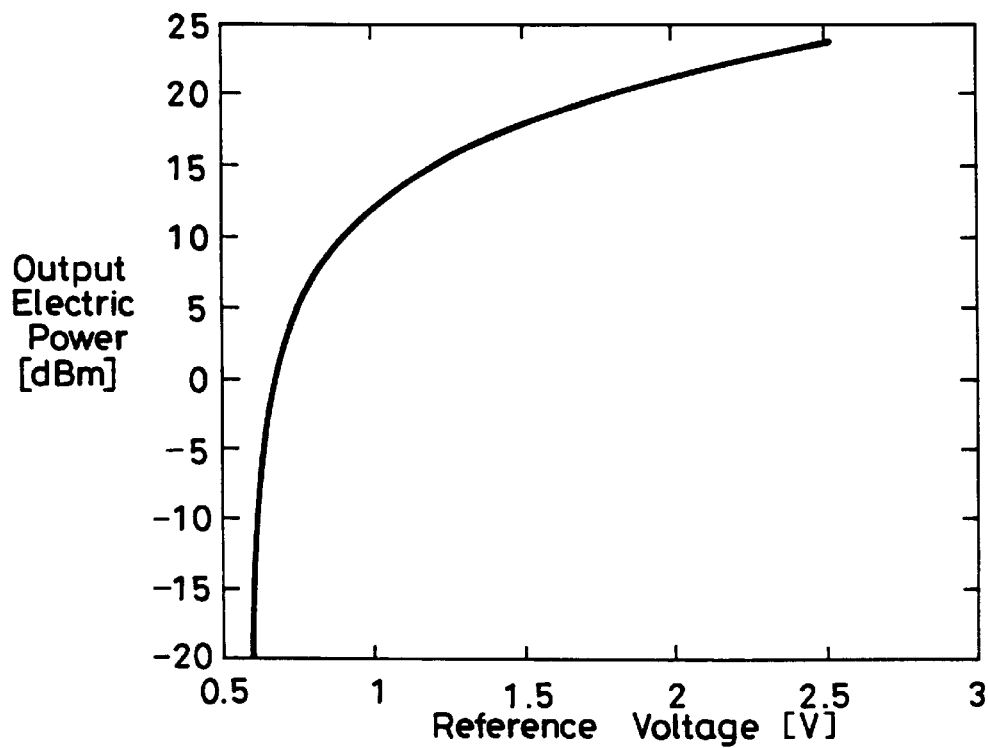
FIG. 4 is a characteristic graph used to explain the conventional circuit shown in FIG. 1.
Figure 5:
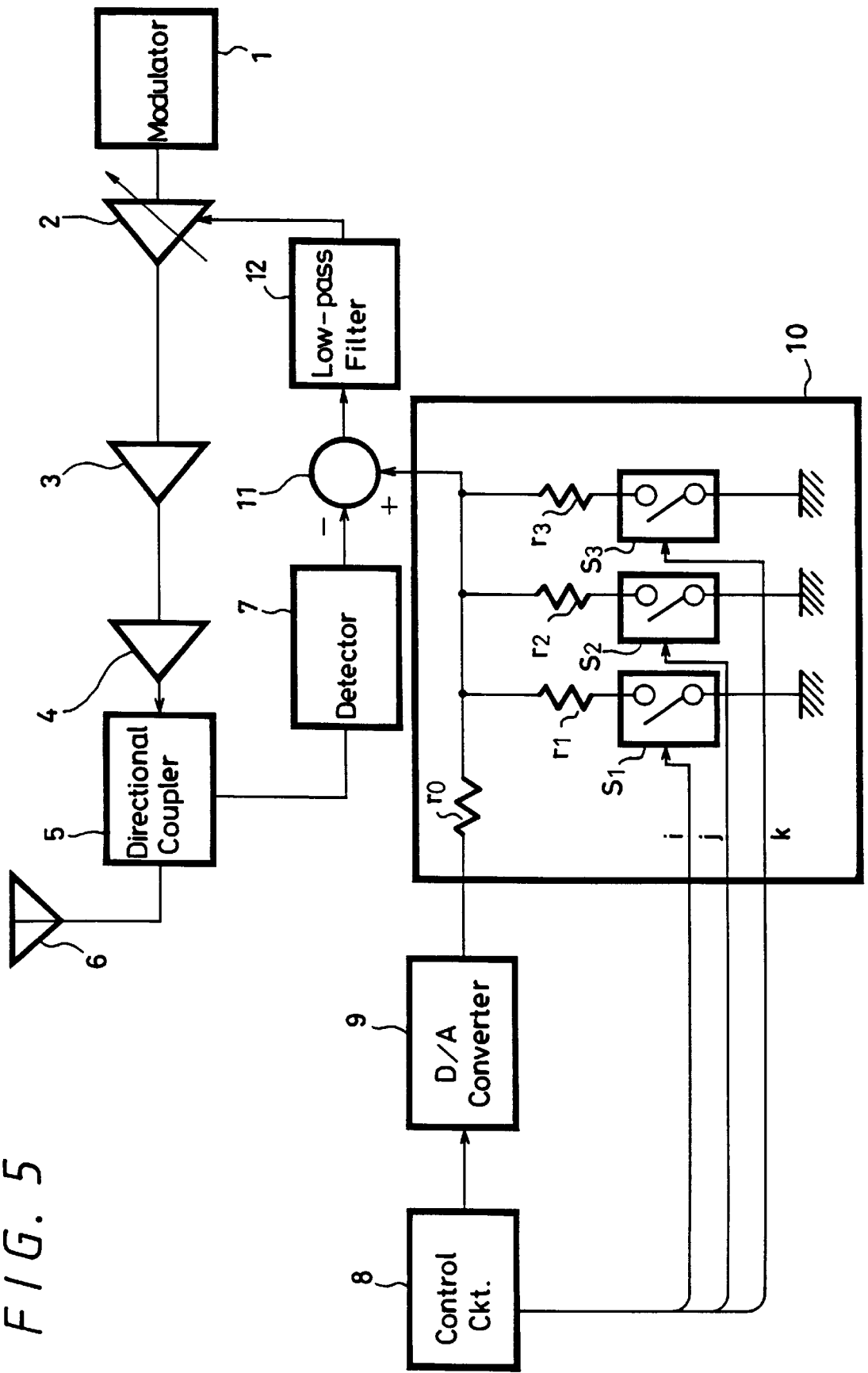
FIG. 5 is a block diagram of a transmitting circuit of a mobile station of a portable telephone system to which the radio transmitter according to the present invention is applied.

The present invention will now be described with reference to FIG. 5. FIG. 5 is a block diagram showing a transmitter circuit of a mobile station of a portable telephone system to which a radio transmitter according to the present invention is applied.

As shown in FIG. 5, a transmission signal modulated by a modulator 1 is amplified by a desired electric power by a variable gain amplifier 2, the excitation amplifier 3 and a final-stage amplifier 4 and supplied through a directional coupler 5 to an antenna 6, from which it is radiated.

The transmission signal distributed by the directional coupler 5 is detected by a detector 7. Thus, the detector 7 outputs a detected voltage which reflects the transmission signal electric power supplied to the antenna 6.

On the other hand, the control circuit 8 generates a signal for setting a D/A converter 9 in such a way as to generate a reference voltage corresponding to a desired transmission signal electric power.

The reference voltage from the D/A converter 9 is supplied to a resistor $r_0$ and a voltage-dividing circuit 10 of a series circuit of resistors $r_1$, $r_2$, $r_3$ and switches $s_1$, $s_2$, $s_3$. These switches $s_1$, $s_2$, $s_3$ are turned on and off under control of control signals i, j, k from the control circuit 8.

The reference voltage divided by the voltage-dividing circuit 10 and the detected voltage from the detector 7 are supplied to a subtracter 11. Further, a subtracted result is supplied through a low-pass filter 12 to the gain control terminal of the variable gain amplifier 2, resulting in the gain of the variable gain amplifier 2 being determined.

Accordingly, in this circuit, the reference voltage from the D/A converter 9 is divided by the resistor $r_0$ and the resistors $r_1$, $r_2$, $r_3$ selected by the control signals. Therefore, if resistance values of these resistors $r_0$, $r_1$, $r_2$, $r_3$ are determined arbitrarily, then the characteristic of the reference voltage divided by the voltage-dividing circuit 10 can be made close to that of the detector 7, and hence the accuracy in setting can be increased.

Specifically, assuming that V is the output voltage of the D/A converter 9, then an output voltage $V_0$ of the voltage-dividing circuit 10 is given by the following equation (15):

$$V_0 = \frac{R}{R+r} V = \frac{1}{1+\frac{r}{R}} V \qquad (15)$$

$$\frac{1}{R} = i\frac{1}{r_1} + j\frac{1}{r_2} + k\frac{1}{r_3}$$

where i, j, k are determined by control bits. i, j, k=0, 1

If the resistance values are selected as $$r_3 = 4a,\ r_2 = 2a\ \text{and}\ r_1 = a \qquad (16)$$

then the output voltage $V_0$ of the voltage-dividing circuit 10 is given by the following equation (17):

$$V_0 = \frac{1}{1+\frac{r}{4a}(4i+2j+k)} V \qquad (17)$$

Therefore, according to this circuit, the output voltage of the D/A converter 9 is divided by the voltage-dividing circuit 10. In this case, when the transmission signal electric power is large, or the reference voltage is high, the reference voltage is set coarsely. On the other hand, when the transmission signal electric power is small, or the reference voltage is low, the reference voltage can be set fine.

Specifically, the changed amounts of the output electric power per 1 LSB are illustrated on the following table 2. Measured values on the table 2 were obtained under the condition that (i, j, k)=(0, 0, 0) when a desired transmission signal electric power is 29 dBm and (i, j, k)=(1, 1, 1) when a desired transmission signal electric power is 9 dBm and r=4a.

TABLE 2

| Desired output electric power | Input electric power to detector | i, j, k | Changed amount of reference voltage per 1 LSB | Changed amount of output electric power with respect to 1 LSB |
|---|---|---|---|---|
| 29 dBm | 15 dBm | 0, 0, 0 | 12 mv | 0.2 dB |
| 9 dBm | −5 dBm | 1, 1, 1 | 1.5 mV | 0.3 dB |

According to the conventional circuit, when the transmission signal electric power is large, the transmission signal electric power can be controlled with a desired accuracy, however, when the transmission signal electric power becomes small, the transmission signal electric power cannot be controlled with a desired accuracy. Further, when the resolution in controlling the transmission signal electric power is increased, there arise various problems such as the increased circuit scale of the D/A converter. However, according to the present invention, the reference voltage for controlling the transmission signal electric power to a predetermined value is set stepwise, the thus the set reference voltage is outputted from the predetermined voltage-dividing means and compared with the detected voltage of the transmission signal electric power, and the transmission signal electric power is controlled in response to the compared output, whereby a desired accuracy can be obtained regardless of the magnitude of the transmission signal electric power. Furthermore, there is then no risk that the circuit scale of the D/A converter is increased. Therefore, the transmission signal electric power can be controlled satisfactorily by the simple arrangement.

According to the present invention, there is provided the radio transmitter in which the modulated signal is amplified by the variable gain amplifier and the power amplifier and supplied to the antenna, the detected voltage which reflects a transmission signal electric power supplied to the antenna is outputted and the detected voltage is compared with an arbitrary reference voltage, the transmission signal electric power is controlled to a predetermined value by controlling the gain of the variable gain amplifier in response to a compared output. In this case, the reference voltage is set stepwise, and the thus set reference voltage is processed by a predetermined voltage-dividing means and compared with the detected voltage. Therefore, a desired accuracy can be obtained regardless of the magnitude of the transmission signal electric power. Furthermore, there is then no risk that the circuit scale of the D/A converter is increased. Therefore, the transmission signal electric power can be controlled satisfactorily by the simple arrangement.

The use of the radio transmitter according to the present invention is not limited to the transmitting circuit of the mobile station in the portable telephone system, for example. When the radio transmitter according to the present invention is applied to the transmitting circuit of the mobile station in the portable telephone system, the standard is not limited to the aforementioned STD-27 of the Japanese digital cellular phone system standardized by Foundation of Radio System Research Center, and the present invention may be applied other digital cellular phone systems, such as the IS-54, IS-95 for North America and the GMS system for European countries.

According to the conventional circuit, when the transmission signal electric power is large, the transmission signal electric power can be controlled with a desired accuracy, however, when the transmission signal electric power becomes small, the transmission signal electric power cannot be controlled with a desired accuracy. Further, when the resolution in controlling the transmission signal electric power is increased, there arises various problems such as the increased circuit scale of the D/A converter. However, according to the present invention, the reference voltage for controlling the transmission signal electric power to a predetermined value is set stepwise, the thus set reference voltage is outputted from the predetermined voltage-dividing means and compared with the detected voltage of the transmission signal electric power, and the transmission signal electric power is controlled in response to the compared output, whereby a desired accuracy can be obtained regardless of the magnitude of the transmission signal electric power. Furthermore, there is then no risk that the circuit scale of the D/A converter is increased. Therefore, the transmission signal electric power can be controlled satisfactorily by the simple arrangement.

Therefore, according to the present invention, the circuit scale of the whole of the apparatus can be reduced, and there can be provided an inexpensive and highly-accurate apparatus.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A transmitter apparatus for transmitting radio waves comprising:
    a variable amplifier for amplifying a transmission signal with a variable amplitude gain and producing an amplified transmission signal;
    a directional coupler for dividing a signal fed thereto in a plurality of directions and producing first and second outputs;
    detecting means for detecting a signal power in said first output from said directional coupler and providing an output signal;
    reference signal generating means for generating a reference signal;
    subtracting means for subtracting said output signal of said detecting means from said reference signal of said reference signal generating means and an output signal of said subtracting means being supplied to said variable amplifier as a gain control signal therefor, wherein said reference signal generating means comprises control means for producing a basic reference signal and for producing a plurality of control signals, setting means for setting said basic reference signal as stepped voltage values in response to said plurality of control signals from said control means, and decreasing voltage means for decreasing a voltage of said basic reference signal produced by said control means, whereby said reference signal fed to said subtracting means is formed of said stepped voltage values and the decreased voltage basic reference signal.

2. The transmitter apparatus for transmitting radio waves as claimed in claim 1, wherein said generating means comprises a digital-to-analog converter for producing said basic reference signal as an analog signal.

3. The transmitter apparatus for transmitting radio waves as claimed in claim 1, wherein said decreasing voltage means of said dividing means comprises a plurality of serial combinations of a resistor and a switch, each controlled by a respective one of said plurality of control signals.

4. The transmitter apparatus for transmitting radio waves as claimed in claim 2, wherein said decreasing voltage means comprises a plurality of serial combinations of a resistor and a switch, each controlled by a respective one of said plurality of control signals.

5. The transmitter apparatus for transmitting radio waves as claimed in claim 1, wherein voltage differences between successive ones of said stepped voltage values are different from each other, and power chances at said second output of said dividing means in response to said each voltage step are nearly the same.

6. The transmitter apparatus for transmitting radio waves as claimed in claim 5, wherein said power difference is measured in dB.

7. The transmitter apparatus for transmitting radio waves as claimed in claim 4, wherein voltage differences between successive ones of said stepped voltage values are different from each other, and power changes at said second output of said dividing means in response to said each voltage step are nearly the same.

8. The transmitter apparatus for transmitting radio wave as claimed in claim 7, wherein said power differences are measured in dB.

* * * * *